(12) United States Patent  
Kitanaka et al.

(10) Patent No.: US 8,174,833 B2  
(45) Date of Patent: May 8, 2012

(54) ELECTRIC POWER CONVERTING APPARATUS

(75) Inventors: Hidetoshi Kitanaka, Chiyoda-ku (JP); Masataka Yabuuchi, Chiyoda-ku (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 421 days.

(21) Appl. No.: 12/599,128

(22) PCT Filed: Jun. 11, 2007

(86) PCT No.: PCT/JP2007/061738  
§ 371 (c)(1), (2), (4) Date: Nov. 6, 2009

(87) PCT Pub. No.: WO2008/152686  
PCT Pub. Date: Dec. 18, 2008

(65) Prior Publication Data  
US 2010/0277871 A1 Nov. 4, 2010

(51) Int. Cl.  
*H05K 7/20* (2006.01)

(52) U.S. Cl. .................................... 361/710

(58) Field of Classification Search .............. 361/96, 361/678, 695, 710, 736, 760, 763  
See application file for complete search history.

(56) References Cited

U.S. PATENT DOCUMENTS  
2002/0121811 A1 9/2002 Hashimoto et al.

FOREIGN PATENT DOCUMENTS

| | | | |
|---|---|---|---|
| JP | 7-15975 | A | 1/1995 |
| JP | 8-33336 | A | 2/1996 |
| JP | 2000-92819 | A | 3/2000 |
| JP | 2002-262583 | A | 9/2002 |
| JP | 2003-79162 | A | 3/2003 |
| JP | 2003-258471 | A | 9/2003 |
| JP | 2003-259657 | A | 9/2003 |
| JP | 2003-259658 | A | 9/2003 |
| JP | 2006-101676 | A | 4/2006 |
| JP | 2006-340490 | A | 12/2006 |
| JP | 2007-104784 | A | 4/2007 |
| SU | 1425107 | A1 | 9/1988 |

OTHER PUBLICATIONS

International Search Report for PCT/JP2007/061738 completed Aug. 21, 2007.  
Written Opinion for PCT/JP2007/061738 completed Aug. 21, 2007.  
Corresponding Japanese Office Action for Application No. 2007-550617, May 13, 2008, with partial English translation. Decision on Patent Grant from Russian Patent Office issued in Applicant's corresponding Russian Patent Application No. 2009149373/07(072993) dated Jul. 22, 2010, and an English Translation thereof.

*Primary Examiner* — Jeremy Norris  
*Assistant Examiner* — Tremesha S Willis  
(74) *Attorney, Agent, or Firm* — Buchanan Ingersoll & Rooney PC

(57) ABSTRACT

A cooling device for cooling a plurality of switching elements included in each of a converter unit and an inverter unit includes a fin base that serves as a switching element attachment plane on which the switching elements are mounted and a plurality of fins arranged on a plane opposite to the switching element attachment plane. When an electric power converting circuit is a single- or multi-phase bridge circuit including a plurality of sets of legs each formed with a positive-side arm and a negative-side arm, the switching elements constituting the legs of different phases are arranged in a row on the fin base in a traveling direction of a railway electric car.

16 Claims, 12 Drawing Sheets

(a)

(b)

ELECTRIC POWER CONVERTING APPARATUS

TECHNICAL FIELD

The present invention relates to an electric power converting apparatus used for railway electric cars.

BACKGROUND ART

An electric power converting apparatus to be installed on a railway electric car includes a converter circuit and an inverter circuit that convert an electric power by causing a switching element configured with an IGBT (Insulated Gate Bipolar Transistor), an IPM (Intelligent Power Module), or the like to perform a switching operation.

The switching elements used in these electric power converting circuits have a conduction loss caused by electric current flows as well as a switching loss caused by the switching operation. Thus, to ensure that the switching elements operate in a stable manner, the heat caused by the loss needs to be efficiently dissipated into the air so that the temperature of the switching elements can be kept lower than a predetermined level.

In a common configuration of a conventional electric power converting apparatus for a railway electric car, the switching elements are positioned on a cooling device, and the cooling device is cooled by a forced air cooling using a fan, so that the heat generated by the switching elements can be dissipated. However, when such a forced air cooling method is used, it is necessary to install a cooling fan and a controlling device, resulting in a problem that the apparatus becomes bulky.

Meanwhile, for the purpose of downsizing the apparatus, a method has been proposed by which switching elements are cooled by using airflows caused by traveling of the railway electric car (see, for example, Patent Document 1 described below). The method disclosed in Patent Document 1 has advantageous characteristics where the structure is relatively simple, the maintenance cost is low, and the load to the environment is reduced because, for example, there is no noise caused by a cooling fan.

Patent Document 1: Japanese Patent Application Laid-open No. 2000-92819

DISCLOSURE OF INVENTION

Problem to be Solved by the Invention

However, as the method by which the switching elements are cooled by using the airflows caused by the traveling of the railway electric car is compared with the forced air cooling method using a fan where a certain amount of airflows is constantly available, the traveling airflow cooling method has a disadvantageous characteristic where the available amount of airflow varies depending on the speed of the railway electric car, which is not constant. Also, it is important to consider what arrangement should be made so that the limited amount of airflows caused by the traveling, which is in the surrounding areas of the railway electric car, can be efficiently utilized in the cooling process of the switching element. Thus, unless it is arranged such that the airflows caused by the traveling are utilized at maximum, the cooling device needs to be increased, causing an increase of the weight.

Specifically, the following aspects are important factors:
(1) How a plurality of switching elements included in an electric power converting circuit should be positioned on a cooling device;
(2) In the case where a large-capacity electric power converting circuit is structured in which it is necessary to connect a plurality of switching elements in parallel, how the parallel-connected elements can be optimally positioned on a cooling device; and
(3) What are good heights for the fins in contact with the outside air and good intervals between the fins in a cooling device?

In Patent Document 1, however, none of the aspects (1) to (3) is taken into consideration. Thus, it is difficult to further make the electric power converting apparatus more compact and more light-weighted.

In view of the circumstances described above, it is an object of the present invention to provide an electric power converting apparatus in which a cooling process is performed by using airflows caused by a vehicle's traveling and that can be even more compact and more light-weighted, by disclosing an advantageous positional arrangement for connecting, in parallel, a plurality of sets each made up of a plurality of switching elements and an advantageous structure of fins in a cooling device.

Means for Solving Problem

To solve the above problems and to achieve the object, an electric power converting apparatus according to the present invention is installed on a railway electric car, the electric power converting apparatus including a cooling device for cooling a plurality of switching elements that constitutes an electric power converting circuit. The cooling device includes a fin base that serves at least as a switching element attachment plane and a plurality of fins that are disposed on an opposite plane of the switching element attachment plane, the fins being exposed to outside air to dissipate heat. In a case where the electric power converting circuit is a single-phase bridge circuit or a multi-phase bridge circuit including a plurality of sets of legs each formed with a positive-side arm and a negative-side arm each including the switching elements, each of the switching elements that constitute a leg of each of the phases is arranged in a row on the fin base in a traveling direction of the railway electric car.

EFFECT OF THE INVENTION

In the electric power converting apparatus according to an aspect of the present invention, a cooling device is configured to include the fin base that serves, at least, as the switching element attachment plane and the fins that are disposed on the opposite plane of the switching element attachment plane. The fins are disposed to be in contact with the outside air for dissipating heat. The sets of switching elements that structure the legs corresponding to the phases are arranged in a row on the fin base in the traveling direction of the railway electric car. With this positional arrangement, it is possible to achieve advantageous effects where it is possible to effectively cool the switching elements and to provide an electric power converting apparatus that can be even more compact and more light-weighted.

EXPLANATIONS OF LETTERS OR NUMERALS

| | |
|---|---|
| 1 | overhead power line |
| 2 | pantograph |
| 3 | wheel |
| 4 | rail |
| 6 | transformer |
| 9 | carriage body |
| 10 | contactor |
| 11 | electric devices |
| 20, 20a, 20b | converter unit |
| 30, 30P, 30N | capacitor |
| 40A | fin base (for converter unit) |
| 40B | fin base (for inverter unit) |
| 42A | fins (for converter unit) |
| 42B | fins (for inverter unit) |
| 45 | IGBT chip |
| 46 | heat pipe |
| 50A | converter cooling device |
| 50B | inverter cooling device |
| UD1A, UD2A, UD1B, UD2B | diode |
| UPC, VPC, UNC, VNC, UPI, VPI, WPI, UNI, VNI, WNI, UPCA, UPCB, UNCA, UNCB, VPCA, VPCB, VNCA, VNCB, UPC1, UPC2, UNC3, UNC4, VPC1, VPC2, VNC3, VNC4, UPC1A, UPC2A, UNC3A, UNC4A, UPC1B, UPC2B, UNC3B, UNC4B, VPC1A, VPC2A, VNC3A, VNC4A, VPC1B, VPC2B, VNC3B, VNC4B | switching element |
| 60 | inverter unit |
| 80 | electric motor |
| 100 | electric power converting apparatus |

BEST MODE(S) FOR CARRYING OUT THE INVENTION

Exemplary embodiments of an electric power converting apparatus according to the present invention will be explained in detail, with reference to the accompanying drawings. The present invention is not limited to the exemplary embodiments described below.

First Embodiment

Figure 1:
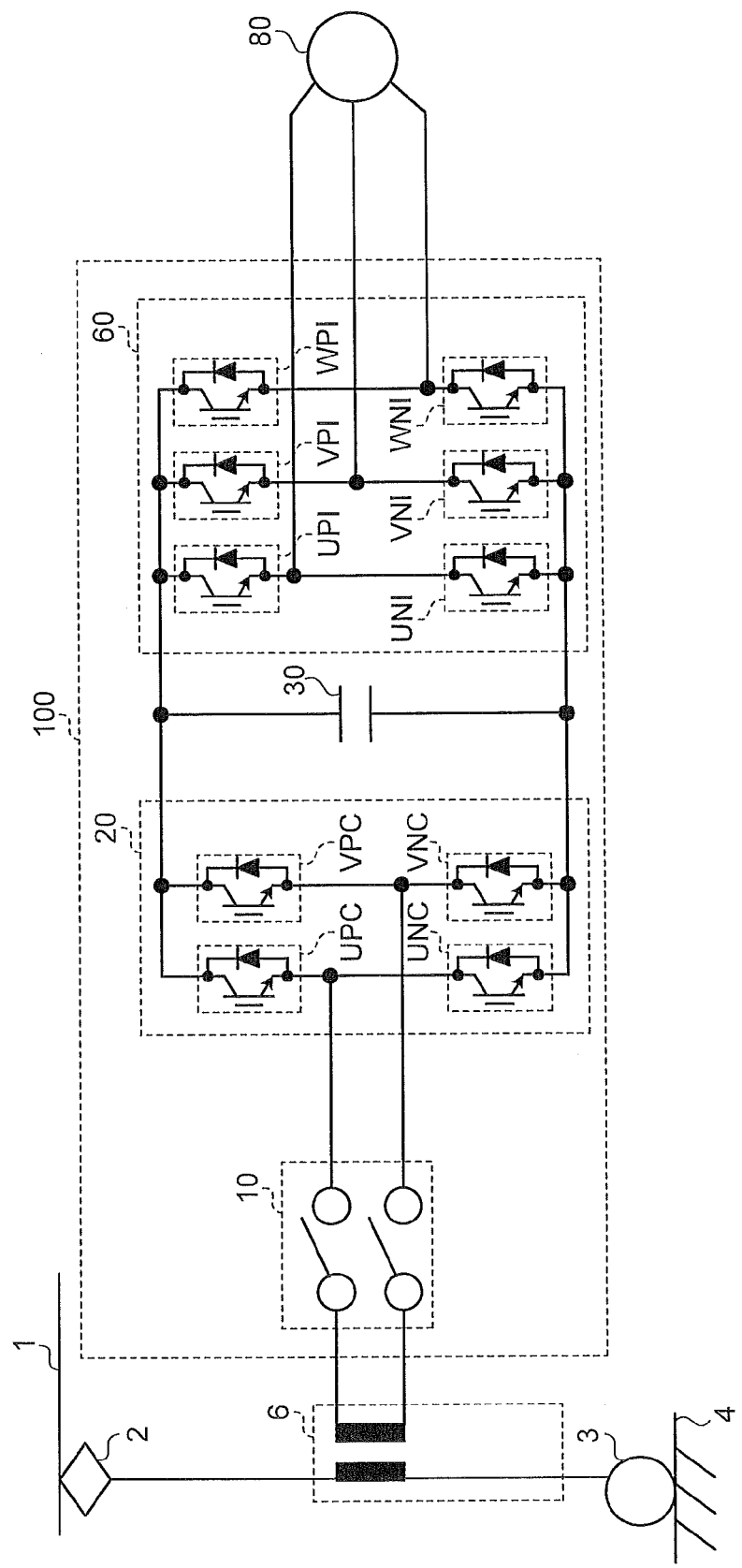
FIG. 1 is a diagram of an example of an electric power converting apparatus according to a first embodiment of the present invention.

FIG. 1 is a diagram of an example of an electric power converting apparatus according to a first embodiment of the present invention. An electric power converting apparatus 100 shown in FIG. 1 is configured to include a converter unit 20, a capacitor 30, and an inverter unit 60 that structure an electric power converting circuit as well as a contactor 10. A transformer 6 is connected to the contactor 10 that is provided at an input end of the electric power converting apparatus 100. An electric motor 80 that drives a railway electric car is connected to the inverter unit 60 that is provided at an output end of the electric power converting apparatus 100. An induction motor or a synchronous motor may be used as the electric motor 80.

In FIG. 1, one end of a primary winding of the transformer 6 is connected to an overhead power line 1 via a pantograph 2, whereas the other end is connected to a rail 4, which is a ground potential, via a wheel 3. An electric power (normally, AC 20 KV to 25 KV) supplied from the overhead power line 1 is input to the primary winding of the transformer 6 via the pantograph 2. Also, an electric power generated in a secondary winding of the transformer 6 is input to the converter unit 20 via the contactor 10.

The contactor 10 is provided between the secondary winding of the transformer 6 and the converter unit 20 and opens and closes an electric power supplying circuit. In the example shown in FIG. 1, a configuration in which both of two AC input lines are turned on and off is shown. However, another arrangement is acceptable in which a contactor is provided for one of the AC input lines.

The converter unit 20 includes circuit parts (hereinafter "legs") each of which is obtained by connecting, in series, a positive-side arm made up of switching elements UPC and VPC (e.g., UPC for a U-phase) and a negative-side arm made up of switching elements UNC and VNC (e.g., UNC for a U-phase). In other words, in the converter unit 20, a single-phase bridge circuit having the two sets of legs (corresponding to a U-phase and a V-phase respectively) is structured. An IGBT element or an IPM element including a built-in antiparallel diode may be used as each of the switching elements UPC, VPC, UNC, and VNC. Another arrangement is acceptable in which a multi-phase bridge circuit is structured by using a larger number of legs. This arrangement is also regarded as being included in the gist of the present invention.

By performing Pulse Width Modulation (PWM) control on the switching elements UPC, VPC, UNC, and VNC, the converter unit 20 converts an AC voltage that has been input thereto into a desired DC voltage and outputs the DC voltage. Various publicly-known examples of detailed configurations of the converter unit 20 and controlling methods therefor are available. Thus, the detailed explanation thereof will be omitted. Also, in the example shown in FIG. 1, the converter unit 20 is shown as a two-level converter circuit. However, another arrangement is acceptable in which the converter unit 20 is configured as, for example, a three-level converter circuit (publicly known). This configuration example will be explained later.

The capacitor 30 that serves as a DC power source is connected, in parallel, to an output end of the converter unit 20. Also, the inverter unit 60 that receives the DC voltage from the capacitor 30 as an input, converts the DC voltage into an AC voltage having an arbitrary voltage level and an arbitrary frequency, and outputs the AC voltage is connected to the output end of the converter unit 20.

The inverter unit 60 includes legs each of which is obtained by connecting, in series, a positive-side arm made up of switching elements UPI, VPI, and WPI (e.g., UPI for a U-phase) and a negative-side arm made up of switching elements UNI, VNI, and WNI (e.g., UNI for a U-phase). In other words, in the inverter unit 60, a three-phase bridge circuit having the three sets of legs (corresponding to a U-phase, a V-phase, and a W-phase respectively) is structured. An IGBT element or an IPM element including a built-in antiparallel diode may be used as each of the switching elements UPI, VPI, WPI, UNI, VNI, and WNI.

By performing PWM control on the switching elements UPI, VPI, WPI, UNI, VNI, and WNI, the inverter unit 60 converts a DC voltage that has been input thereto into a desired AC voltage and outputs the AC voltage. Various publicly-known examples of detailed configurations of the inverter unit 60 and controlling methods therefor will be omitted. Also, in the example shown in FIG. 1, the inverter unit 60 is shown as a two-level inverter circuit. However, another arrangement is acceptable in which the inverter unit 60 is configured as, for example, a three-level inverter circuit (publicly known). This configuration example will be explained later. Also, in the example shown in FIG. 1, the configuration in which the number of legs is three (i.e., corresponding to three phases) is shown. However, the present invention is no limited to this number of legs.

In FIG. 1, the example in which the electric power converting apparatus is applied to the railway electric car having the AC input is shown as an exemplary embodiment of the electric power converting apparatus according to the first embodiment. However, similarly, it is possible to apply the electric power converting apparatus to a railway electric car having a DC input, which is often used as a subway, a suburban train, or the like. In the case where the electric power converting apparatus is applied to a railway electric car having a DC input, it is possible to use a configuration similar to the one shown in FIG. 1, except that the transformer 6 and the converter unit 20 can be omitted. Thus, needless to say, it is acceptable to apply the contents of the first embodiment to such a railway electric car having a DC input.

Figure 2:
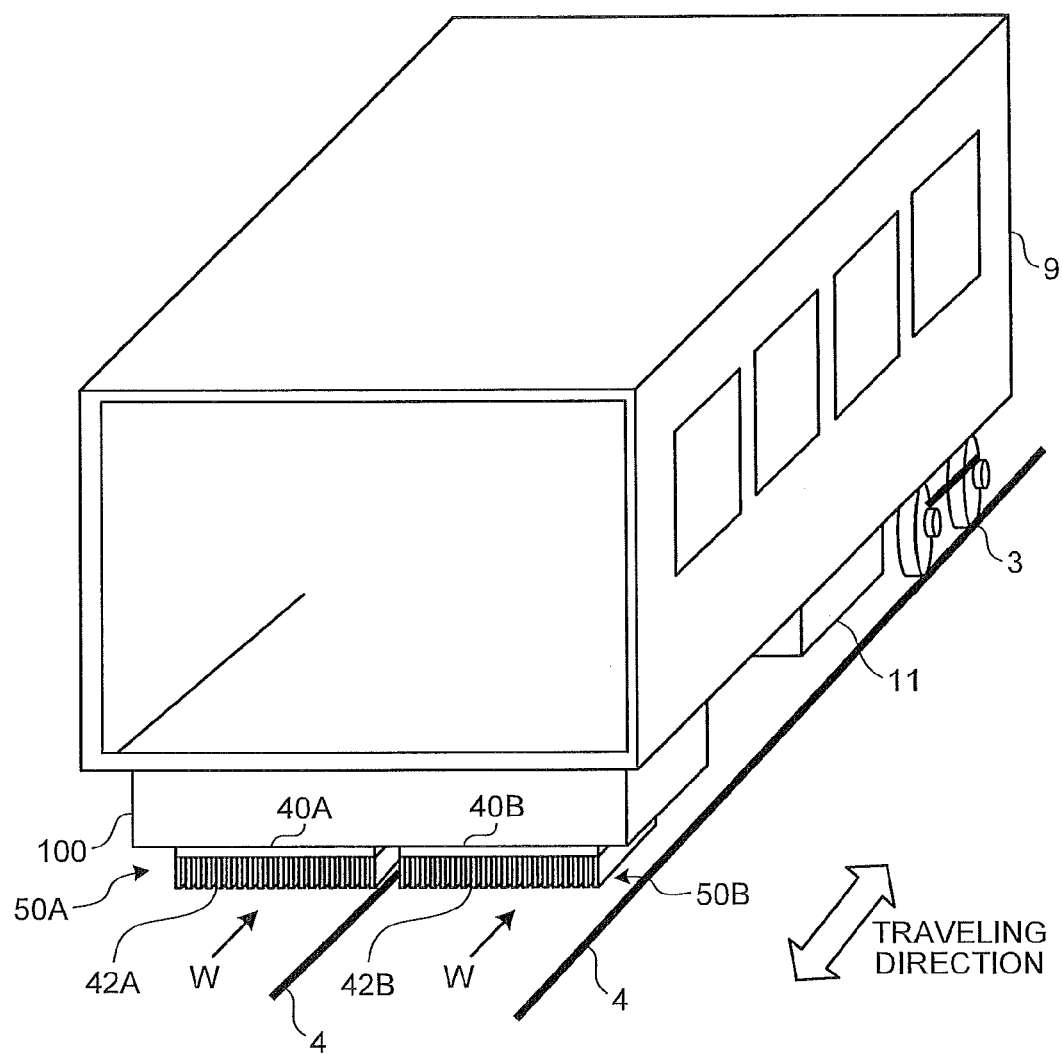
FIG. 2 is a drawing of an example for explaining how an electric power converting apparatus is installed on a railway electric car according to the first embodiment of the present invention.

FIG. 2 is a drawing of an example for explaining how the electric power converting apparatus is installed on the railway electric car according to the first embodiment of the present invention. As shown in FIG. 2, the electric power converting apparatus 100 is disposed beneath the floor of a carriage body 9 of the railway electric car, together with other electric devices 11. On the bottom surface of the electric power converting apparatus 100, a converter cooling device 50A including a fin base 40A and a plurality of fins 42A as well as an inverter cooling device 50B including a fin base 40B and a plurality of fins 42B are disposed. The fins 42A and the fins 42B are in contact with the outside air. When the electric power converting apparatus 100 is disposed in this manner, airflows (hereinafter, "traveling airflows") W caused by the traveling of the railway electric car to be in a direction opposite to the traveling direction of the railway electric car flow through the fins 42A and 42B, so that the heat generated by the switching elements is dissipated into the air via the fins 42A and 42B.

Figure 3:
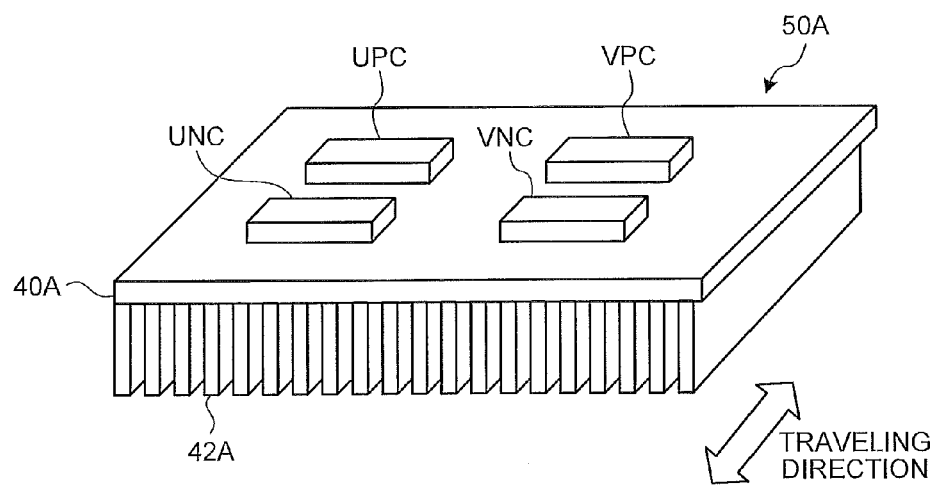
FIG. 3 is a drawing of an example of a positional relationship between a converter cooling device and switching elements according to the first embodiment of the present invention.

FIG. 3 is a drawing of an example of a positional relationship between the converter cooling device 50A and the switching elements UPC, UNC, VPC, and VNC according to the first embodiment of the present invention. In the following sections, the fin base 40A and the fins 42A included in the converter cooling device 50A and the fin base 40B and the fins 42B included in the inverter cooling device 50B will be simply referred to as a fin base 40 and the fins 42, unless they need to be particularly distinguished from one another.

As shown in FIG. 3, the switching elements UPC, VPC, UNC, and VNC are disposed on a plane of the fin base 40. As explained later, each of the switching elements has a rectangular shape and is positioned so that the long-side direction is perpendicular to the traveling direction of the railway electric car. The fins 42 are fixed onto the fin base 40 by using wax or the like. The fins 42 are positioned while being oriented in such directions that the airflows caused by the traveling of the railway electric car can be drawn through the fins 42. Aluminum may be used as a material of which the fins 42 and the fin base 40 are made.

Figure 4:
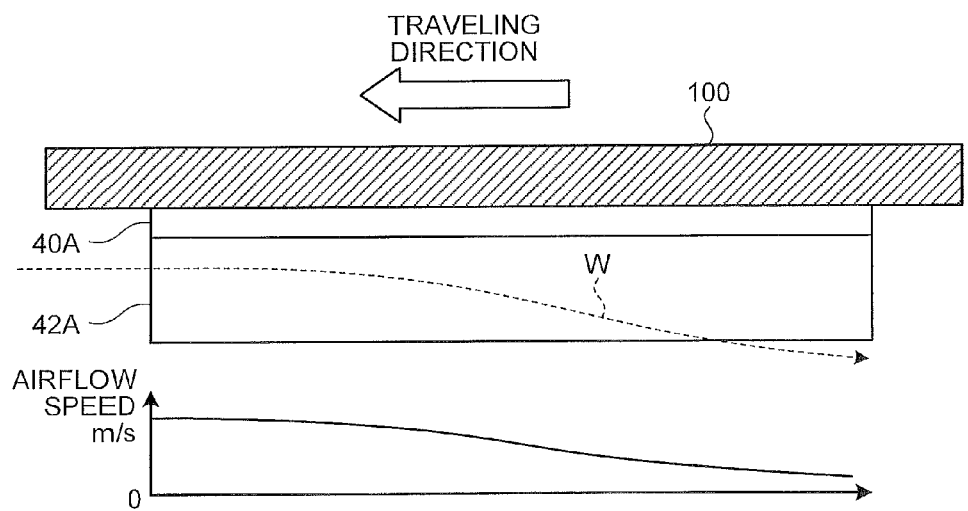
FIG. 4 is a drawing for explaining airflow speed characteristics of an airflow flowing through fins according to the first embodiment of the present invention.

FIG. 4 is a drawing for explaining airflow speed characteristics of an airflow flowing through the fins 42 according to the first embodiment of the present invention. In FIG. 4, a flow of a traveling airflow W that is observed while the fin base 40 and the fins 42 are viewed from a side of the carriage shown in FIG. 2 and the speed of the airflow flowing through the fins 42 are shown.

As shown in FIG. 4, the following characteristics are observed in a simulation: the traveling airflow W that has flowed into the fins 42 from a previous section (the left-hand side of the drawing) due to the traveling of the railway electric car flows outward to the outside of the fins 42 (i.e., in a direction to be away from the fin base 40) as the airflow travels forward to a following section (i.e., the right-hand side of the drawing); and the airflow speed is at its maximum in the previous section and becomes lower as the airflow travels forward to the following section.

The reasons for these characteristics can be explained as follows: While the traveling airflow W flows through the fins 42, the traveling airflow W leaks toward the lower side of the fins 42 because the lower part of the fins 42 is not restrained by a duct or the like; and the airflow speed gradually becomes lower because of frictions with the surfaces of the fins 42.

Accordingly, it is preferable to arrange the traveling-direction lengths of the fin base 40 and the fins 42 to be as short as possible.

Figure 5:
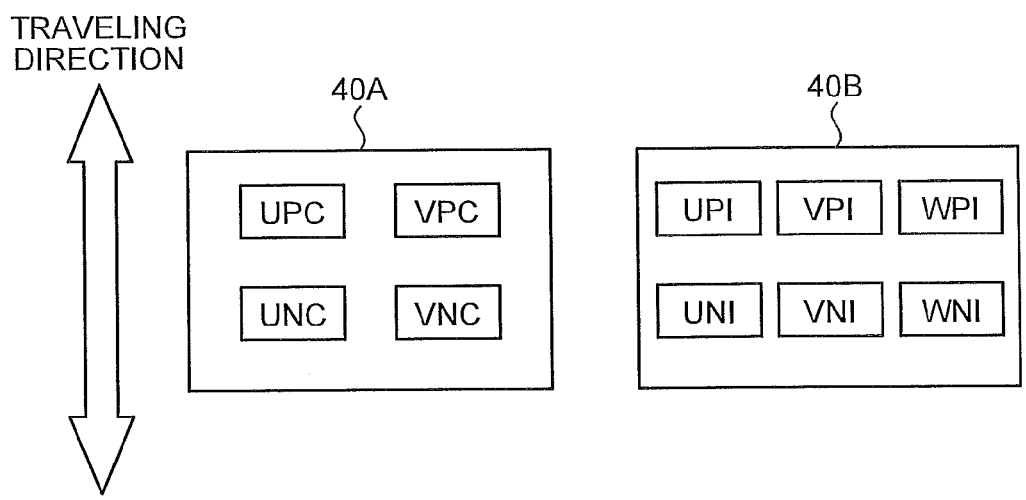
FIG. 5 is a drawing of an example of a positional arrangement of switching elements disposed on a fin base according to the first embodiment of the present invention.
Figure 6:
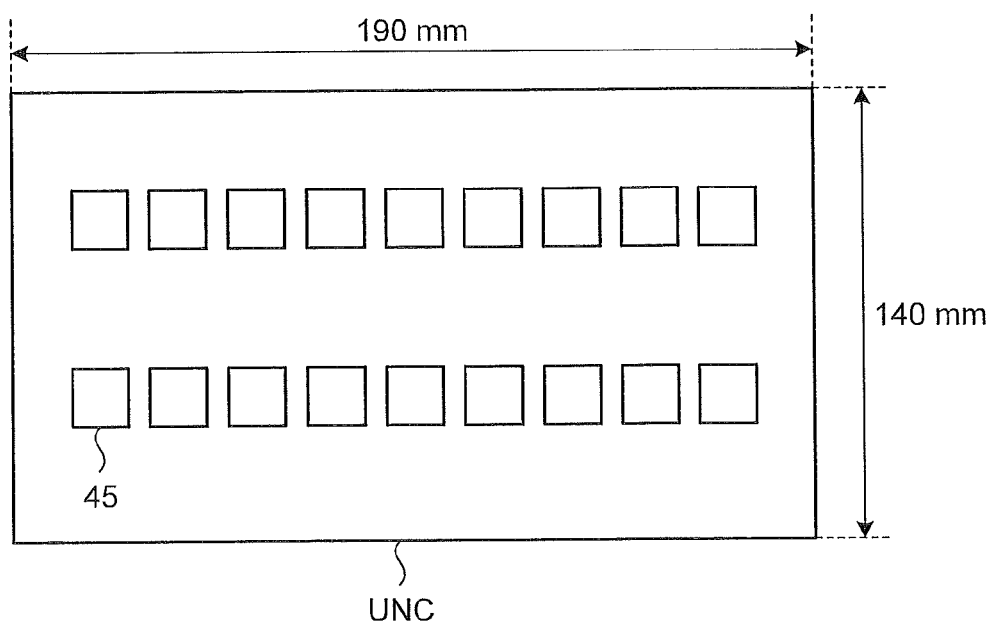
FIG. 6 is a diagram of an internal configuration of a switching element.

FIG. 5 is a drawing of an example of a positional arrangement of the switching elements disposed on the fin base 40 according to the first embodiment of the present invention. FIG. 6 is a diagram of an internal configuration of a switching element.

Generally speaking, a switching element configured with an IGBT module or an IPM module has a rectangular shape and is configured to include a plurality of sets each made up of a large number of IGBT chips that are connected in parallel. As a result, as shown in FIG. 6, in a typical positional arrangement of IGBT chips 45, the number of elements arranged in the long-side direction is larger than the number of elements arranged in the short-side direction.

When the switching elements configured as described above are used, it is possible to minimize the size of the fins 42 in the traveling direction by positioning each of the switching elements (e.g., UPC) so that the long sides thereof extend in a direction perpendicular to the traveling direction, as shown in FIG. 5. As a result, it is possible to keep the lowering of the speed of the traveling airflows W minimum at the positions of the switching elements on the airflow downstream side. Consequently, it is possible to keep the increase in the temperatures of the switching elements on the airflow downstream side minimum.

Further, as shown in FIG. 5, the legs corresponding to the different phases are arranged in a row in the same direction as the traveling direction of the railway electric car. In other words, a switching element (e.g., UPC) in a positive-side arm and a switching element (e.g., UNC) in a negative-side arm that structure one leg are arranged in a row in the same direction as the traveling direction of the railway electric car.

With this positional arrangement, the number of switching elements through which the traveling airflows W pass between the flow-in from the previous section of the fins 42 and the flow-out to the following section is always two and is minimized, regardless of the number of phases in the bridge circuit in the converter unit 20 or the inverter unit 60. Thus, an advantageous effect is achieved where it is possible to alleviate the circumstances in which the temperatures of the traveling airflows W rise due to the heat generated by the switching elements positioned on the airflow upstream side, and as a result of the temperature rise, the temperatures of other switching elements positioned on the airflow downstream side also rise.

Figure 7:
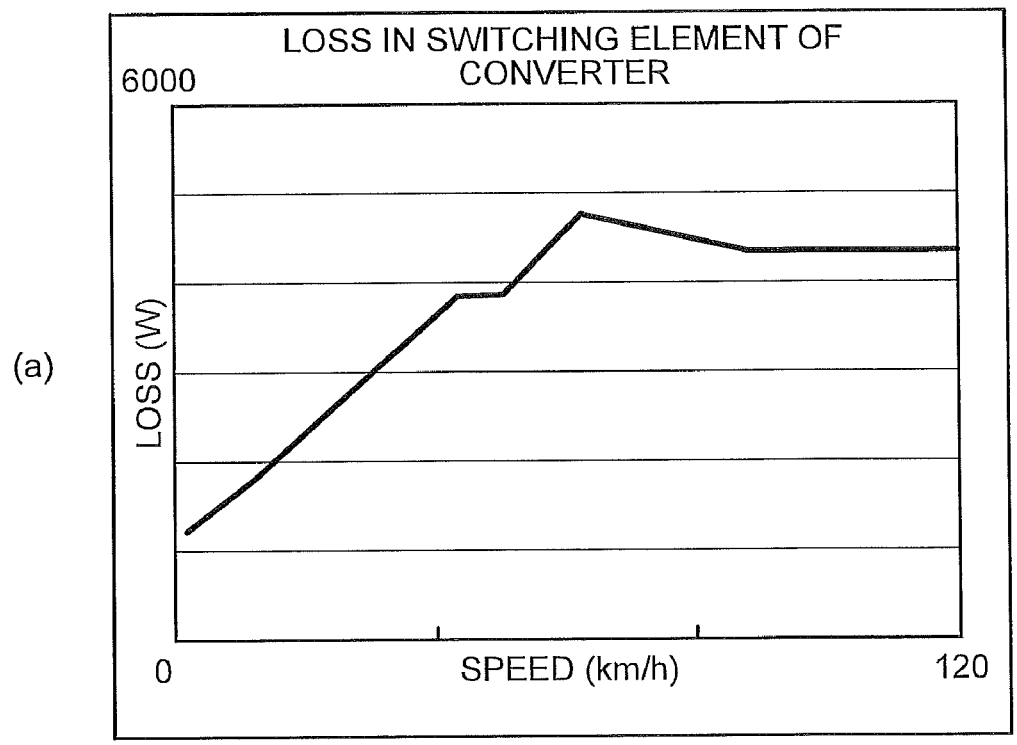
FIG. 7 includes charts for explaining examples of losses caused in a converter unit and an inverter unit with respect to the speed of a railway electric car according to the first embodiment of the present invention.
Figure 7:
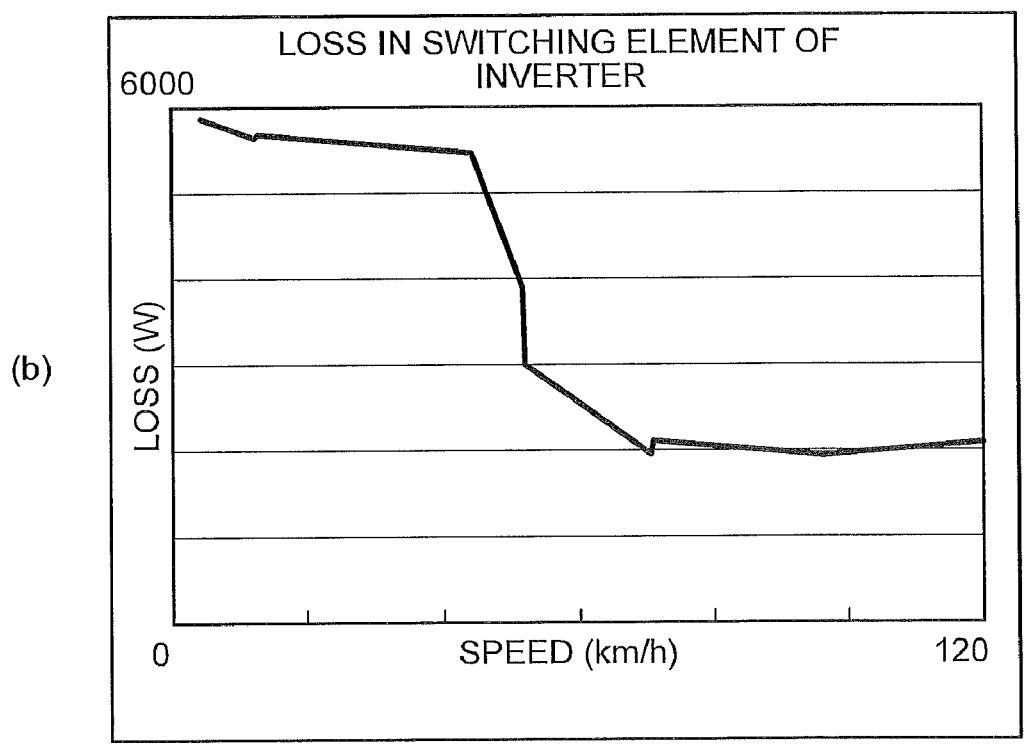

Next, characteristics of losses in the converter unit 20 and the inverter unit 60 with respect to the speed of a railway electric car will be explained, with reference to FIG. 7. FIG. 7 includes charts for explaining examples of losses caused in the converter unit 20 and the inverter unit 60 with respect to the speed of a railway electric car according to the first embodiment of the present invention. The charts show the characteristics corresponding to a commonly-used railway electric car having an AC input.

First, loss characteristics of the converter unit 20 will be explained. As shown in FIG. 7(a), the loss in the converter unit 20 has characteristics where the loss increases as the speed increases and reaches the maximum level when the speed becomes as high as approximately 30% to 50% of the highest speed, and the loss substantially stays at the maximum level until the speed reaches the highest speed. These characteristics derive from torque control characteristics of the railway electric car.

To explain further by using an example in which the railway electric car is performing a power running operation, constant-torque control is performed on the electric motor 80 from the time when the railway electric car is started until the time when the speed becomes as high as approximately 30% to 50% of the highest speed. As a result, the required electric power increases in proportion to the speed. Consequently, in the case where the power source voltage is constant, the electric current in the converter unit 20 increases substantially in proportion to the speed. Thus, the loss caused in the converter unit 20 has a characteristic where the loss increases substantially in proportion to the speed.

In contrast, in a range where the speed of the railway electric car is equal to or higher than approximately 30% to 50% of the highest speed, constant-power control is performed on the electric motor 80. As a result, the required electric power is substantially constant, regardless of the speed. Consequently, in the case where the power source voltage is constant, the electric current in the converter unit 20 is substantially constant regardless of the speed. Thus, the loss caused in the converter unit 20 has a characteristic where the loss is substantially constant, regardless of the speed.

Next, loss characteristics in the inverter unit 60 will be explained. As shown in FIG. 7(b), the loss in the inverter unit 60 has characteristics where the lower the speed is, the larger the loss is, and the loss is relatively large until the speed becomes as high as approximately 30% to 50% of the highest speed. However, in the speed range thereafter, the loss greatly decreases and stays at that level until the speed becomes the highest speed. These characteristics mainly derive from characteristics of the electric current in the electric motor and characteristics of a switching frequency of the inverter unit 60.

Like the explanation of the converter unit 20, to explain further while using an example in which the railway electric car is performing a power running operation, constant-torque control is performed on the electric motor 80 at the maximum torque from the time when the railway electric car is started until the time when the speed becomes as high as approximately 30% to 50% of the highest speed. As a result, the electric current in the electric motor is at the maximum level. Further, because non-synchronous PWM control is performed to keep the switching frequency of the switching elements approximately at 1000 hertz, both a large amount of conduction loss and a large amount of switching loss are caused. Consequently, the loss in the inverter unit 60 is at the maximum level.

In contrast, in a range where the speed of the railway electric car is equal to or higher than approximately 30% to 50% of the highest speed, the switching elements in the inverter unit 60 are in a PWM mode, which is also called a synchronous one-pulse mode. This mode is realized by a publicly known technique. As for the number of times the switching operation is performed, the switching elements perform a switching operation only once in a half cycle of the output voltage of the inverter unit 60 while being in the synchronous one-pulse mode. As a result, the switching loss largely decreases. In addition, while the switching elements are in the synchronous one-pulse mode, the output frequency of the inverter unit 60 increases as the speed of the railway electric car increases. Thus, the switching loss has a tendency of gradually increasing; however, because the value of the switching loss is not so large, the loss caused in the inverter unit 60 has a characteristic where the loss is substantially constant, regardless of the speed of the railway electric car.

Figure 8:
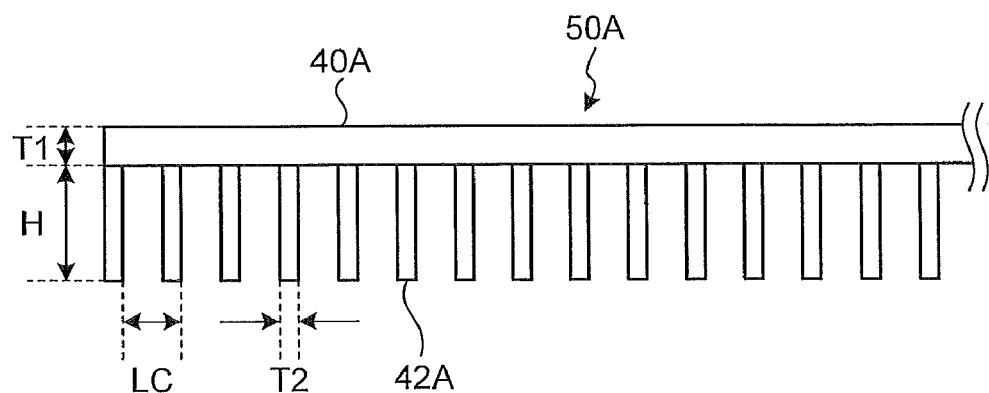
FIG. 8 is a drawing of an example of a converter cooling device according to the first embodiment of the present invention.

FIG. 8 is a drawing of an example of the converter cooling device 50A according to the first embodiment of the present invention. FIG. 8 is a front view obtained by viewing the configuration of converter cooling device 50A from the traveling direction of the railway electric car. In FIG. 8, the thickness of the fin base 40A (hereinafter, the "fin base thickness") is indicated as T1, whereas the height of each of the fins 42A (hereinafter, the "fin height") is indicated as H, while the individual intervals between the fins 42A (hereinafter, the "fin pitch") is indicated as LC, and the thickness of each of the fins 42A (hereinafter, the "fin thickness") is indicated as T2.

Figure 9:
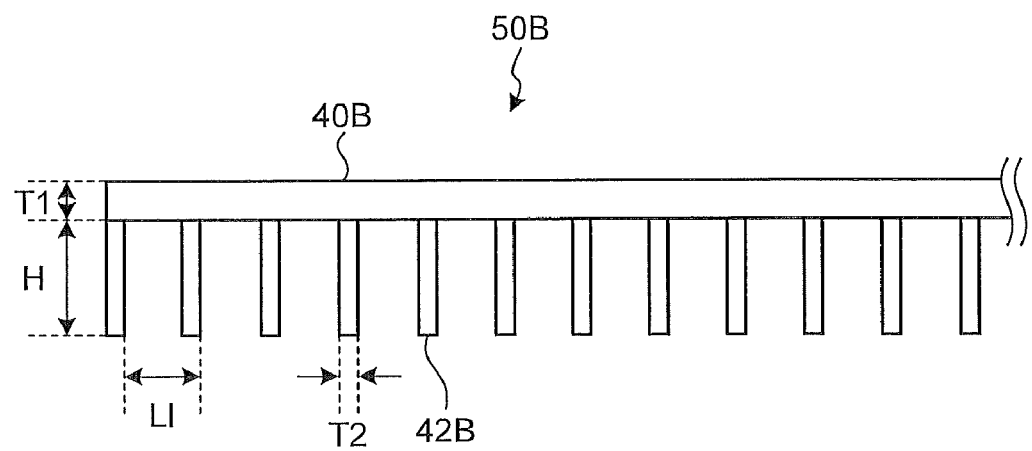
FIG. 9 is a drawing of an example of an inverter cooling device according to the first embodiment of the present invention.

FIG. 9 is a drawing of an example of the inverter cooling device 50B according to the first embodiment of the present invention. FIG. 9 is a front view obtained by viewing the configuration of the inverter cooling device 50B from the traveling direction of the railway electric car. In FIG. 9, the fin base thickness of the fin base 40B is indicated as T1, whereas the fin height of each of the fins 42B is indicated as H, while the fin pitch between the fins 42B is indicated as LI, and the fin thickness of each of the fins 42B is indicated as T2. In other words, a major difference between the configurations of the converter cooling device 50A and the inverter cooling device 50B is the difference in the fin pitches between the fins.

Figure 10:
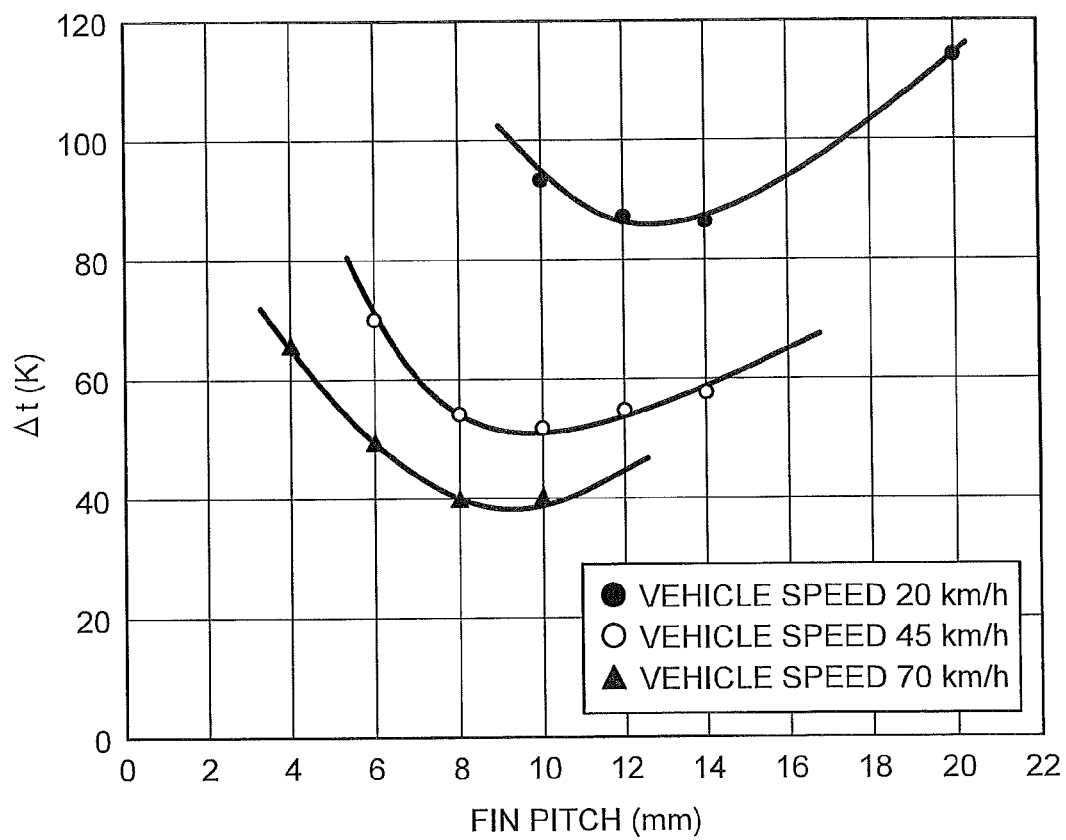
FIG. 10 is a chart for explaining an example of cooling performance levels of a converter cooling device (or an inverter cooling device) according to the first embodiment of the present invention.

FIG. 10 is a chart for explaining an example of cooling performance levels of the converter cooling device 50A (or the inverter cooling device 50B) according to the first embodiment of the present invention. In FIG. 10, the horizontal axis expresses the fin pitch (i.e., the individual intervals between the fins 42A [or the fins 42B]), whereas the vertical axis expresses values obtained from an experiment related to a cooling performance index (i.e., a value showing a temperature rise of the fins when a given loss is applied thereto).

In FIG. 10, the curve connecting the black dots indicates a cooling performance characteristic obtained when the speed is 20 km/h, whereas the curve connecting the white dots indicates a cooling performance characteristic obtained when the speed is 45 km/h, while the curve connecting the black triangles indicates a cooling performance characteristic obtained when the speed is 70 km/h.

The data shown in FIG. 10 corresponds to an example in which the parameters of the fins 42 are configured so that the fin height H is 150 mm, whereas the fin thickness T2 is 3 mm, while the fin base thickness T1 of the cooling device is 20 mm. The fin height H is restricted by the clearance dimension beneath the floor of the railway electric car and is usually set to a value in a range from 100 mm to 200 mm. For maintaining a thermal capacity that is able to tolerate a transitional increase in the switching element loss caused by an overload, a value between 20 mm and 40 mm is normally selected as the fin base thickness T1. Because the fins 42 are exposed beneath the railway electric car and because there is a possibility that snow may hit the fins 42 or stones on the railway track may hit the fins 42 when a block of snow falls off the floor-bottom of the railway electric car and causes the stones to fly up, a value between 2 mm and 4 mm is normally selected as the fin thickness T2, for the purpose of inhibiting damages to the fins 42.

Of the parameters described above, the fin height H and the fin base thickness T1 hardly have impacts on the characteristics shown in FIG. 10. Thus, the data shown in FIG. 10 is applicable even in the case where the fin height H is set to a value within the range from 100 mm to 200 mm and the fin base thickness T1 is set to a value within the range from 20 mm to 40 mm.

In this situation, when the fin thickness T2 is varied, the characteristics shown in FIG. 10 also slightly change. As for the characteristics related to the amounts of changes, when the fin thickness T2 is set to 3 mm as a reference value, if the fin thickness T2 is increased by 1 mm, the optimal pitch increases by approximately 1.5 mm, whereas if the fin thickness T2 is decreased by 1 mm, the optimal pitch decreases by approximately 1.5 mm.

The reason for these changes can be explained as follows: When the fin thickness T2 is increased (or decreased) while the fin pitch is fixed, while the intervals between the fins become smaller (or larger) in correspondence with the increase (or the decrease) in the fin thickness T2, the resistance that is caused when the traveling airflows W flow through the fins increases (or decreases) so that the airflow speed becomes lower (or becomes higher). As a result, the optimal value of the fin pitch increases (or decreases).

Returning to the explanation of the cooling performance shown in FIG. 10, it is understood from FIG. 10 that, if the fin pitch is the same, the higher the speed is, the higher is the cooling performance level. It is also understood that, if the speed is the same, the cooling performance level is degraded when the fin pitch is too small or too large. Accordingly, it is understood that there is an optimal fin pitch according to each of different speeds.

The reason why there is an optimal fin pitch according to each of different speeds can be explained as follows. When the fin pitch is set to a smaller value for the same speed, the following two phenomena occur at the same time: (i) the number of fins 42 provided on the fin base 40 becomes larger, and the heat-dissipating surface area becomes larger to contribute to improvement of the cooling performance; and (ii) the resistance that is caused when the traveling airflows W flow through the fins increases, and the speed of the airflows flowing through the fins decreases to contribute to degradation of the cooling performance. Conversely, when the fin pitch is set to a larger value, the following two phenomena occur at the same time: (i) the number of fins 42 provided on the fin base 40 becomes smaller, and the heat-dissipating surface area becomes smaller to contribute to degradation of the cooling performance; and (ii) the resistance that is caused when the traveling airflows W flow through the fins decreases, and the decrease amount in the speed of the airflows flowing through the fins becomes smaller to contribute to improvement of the cooling performance. In other words, the balanced point between the two factors is the point at which the cooling performance is at the maximum level for the speed.

When a forced air cooling method (i.e., a conventional method) using a fan is applied to obtain a constant amount of airflows regardless of the speed, even if the fin pitch is set to a smaller value to increase the heat-dissipating surface area, it is possible to maintain the cooling performance level by increasing the airflow speed. Thus, it is assumed that there is no tight restriction about the fin pitch or the like.

In contrast, when the cooling method that utilizes the airflows caused by the traveling of the railway electric car is used, because the speed of the traveling airflows W changes depending on the speed, it is an important factor how the fin pitch is determined.

In FIG. 7, it is indicated that the loss in the converter unit 20 is at the maximum level in the range where the speed is high, whereas the loss in the inverter unit 60 is at the maximum level in the range where the speed is low. As these characteristics are taken into consideration, it is preferable to set the fin pitch between the fins 42A for the converter unit 20 to a small value so that the cooling performance becomes higher in the range where the speed is high, whereas it is preferable to set the fin pitch between the fins 42B for the inverter unit 60 to a small value so that the cooling performance becomes higher in the range where the speed is low. In other words, it is preferable to select mutually different optimal fin pitches for the converter unit 20 and for the inverter unit 60.

Second Embodiment

Figure 11:
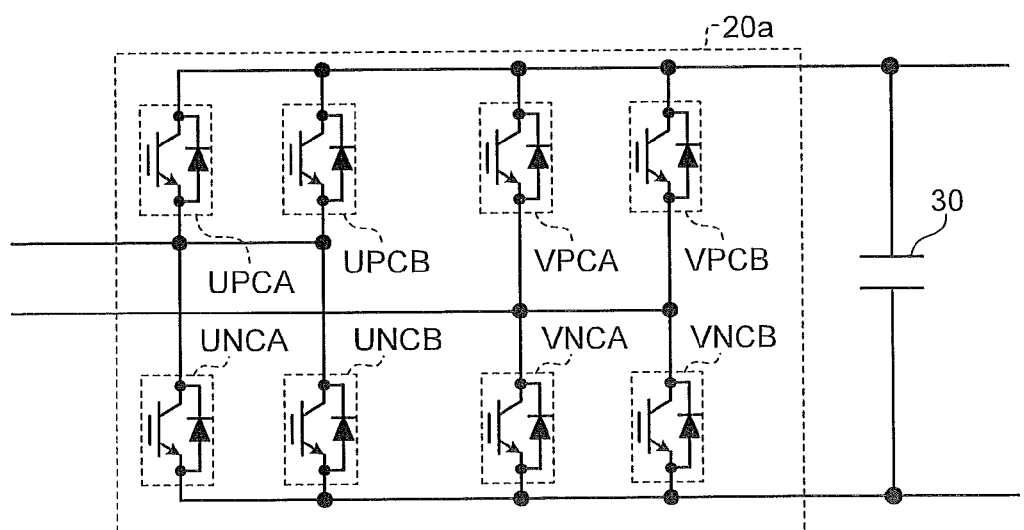
FIG. 11 is a diagram of an example of a circuit configuration of a converter unit according to a second embodiment of the present invention.

FIG. 11 is a diagram of an example of a circuit configuration of a converter unit according to a second embodiment of the present invention. A converter unit 20a shown in FIG. 11 has a circuit configuration different from that of the converter unit 20 according to the first embodiment shown in FIG. 1 in that the switching elements included in each of the arms are connected in parallel.

In FIG. 11, in a U-phase positive-side arm, switching elements UPCA and UPCB are connected in parallel, whereas in a U-phase negative-side arm, switching elements UNCA and UNCB are connected in parallel. In a V-phase positive-side arm, switching elements VPCA and VPCB are connected in parallel, whereas in a V-phase negative-side arm, switching elements VNCA and VNCB are connected in parallel.

Figure 12:
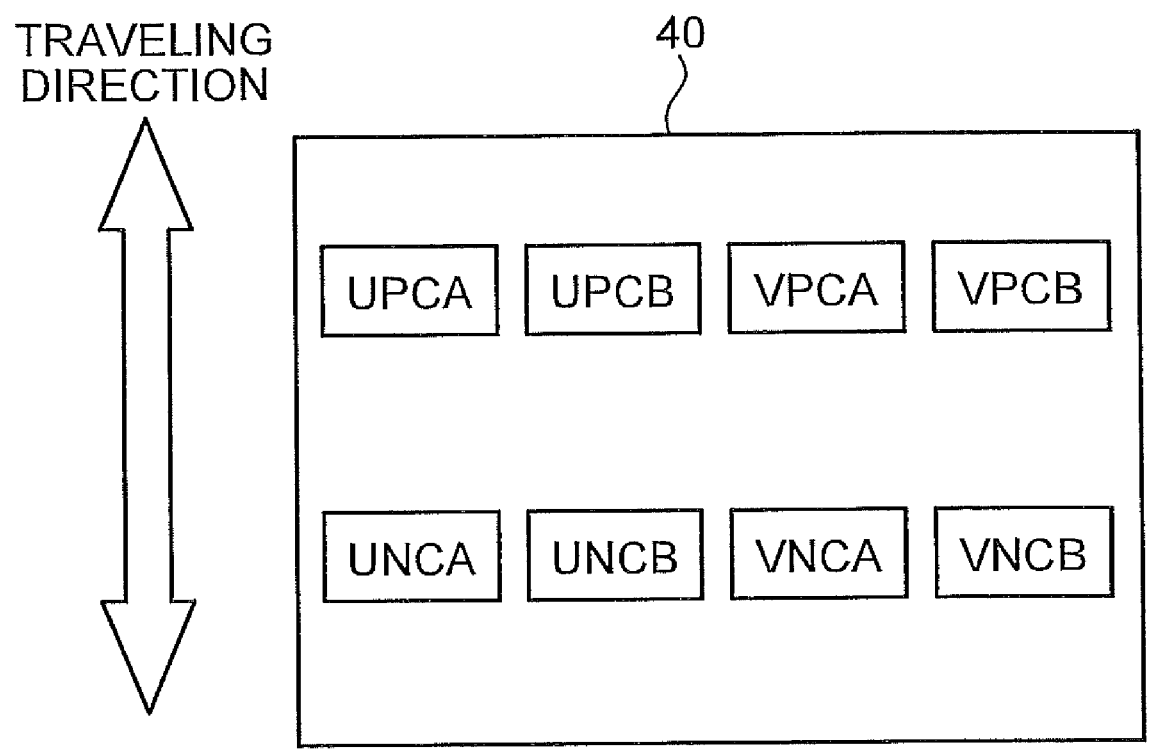
FIG. 12 is a drawing of an example of a positional arrangement of switching elements disposed on a fin base according to the second embodiment of the present invention.

Next, an example of a positional arrangement of the switching elements that is suitable for the situation in which the switching elements are connected in parallel will be explained. FIG. 12 is a drawing of an example of a positional arrangement of the switching elements disposed on the fin base 40 according to the second embodiment of the present invention. As shown in FIG. 12, in addition to the positioning method described in the first embodiment, the switching elements that are connected in parallel in each of the arms are arranged in a row in a direction that is perpendicular to the traveling direction.

With this positional arrangement, it is possible to have an arrangement in which the elements in a pair (e.g., the switching elements UPCA and UPCB in the U-phase positive-side arm) that are connected in parallel in any one of the arms have a temperature that is substantially equal to each other because the elements in the pair are positioned to be at an equal distance from the front edge of the fins provided on the airflow upstream side. Generally speaking, a forward-direction voltage drop for each of the switching elements changes depending on the temperature. Thus, in any of the pairs, when the temperatures of the switching elements that are connected in parallel are different from each other, the forward-direction voltage drops of the switching elements in the pair are different from each other. As a result, a problem arises where the electric current distribution ratio between the switching elements in the pair is degraded so that, for example, the electric current is concentrated in one of the switching elements.

In contrast, according to the second embodiment, the switching elements that are connected in parallel are positioned to be at an equal distance from the front edge of the fins provided on the airflow upstream side. As a result, it is possible to substantially equalize the temperatures of the elements connected in parallel in each of the pairs and to realize an excellent electric current distribution.

Further, it is possible to minimize the size of the fins 42 in the traveling direction. As a result, it is possible to keep the decrease in the speed of the traveling airflows W at minimum at the positions of the switching elements positioned on the airflow downstream side. Consequently, it is possible to keep the increase in the temperatures of the switching elements positioned on the airflow downstream side at minimum.

In addition, it is possible to minimize the number of switching elements through which the traveling airflows W pass between the flow-in from the previous section of the fins 42 and the flow-out to the following section, so that the number of switching elements is the same as in the example where the switching elements are not connected in parallel. Thus, an advantageous effect is achieved where it is possible to alleviate the circumstances in which the temperatures of the traveling airflows W rise due to the heat generated by the switching elements positioned on the airflow upstream side, and as a result of the temperature rise, the temperatures of other switching elements positioned on the airflow downstream side also rise.

Furthermore, the number of switching elements through which the traveling airflows W pass between the flow-in from the previous section of the fins 42 and the flow-out to the following section is always two and is minimized, regardless of the number of phases in the bridge circuit in the converter unit 20 or the inverter unit 60. Thus, an advantageous effect is achieved where it is possible to alleviate the circumstances in which the temperatures of the traveling airflows W rise due to the heat generated by the switching elements positioned on the airflow upstream side, and as a result of the temperature rise, the temperatures of other switching elements positioned on the airflow downstream side also rise.

Third Embodiment

Figure 13:
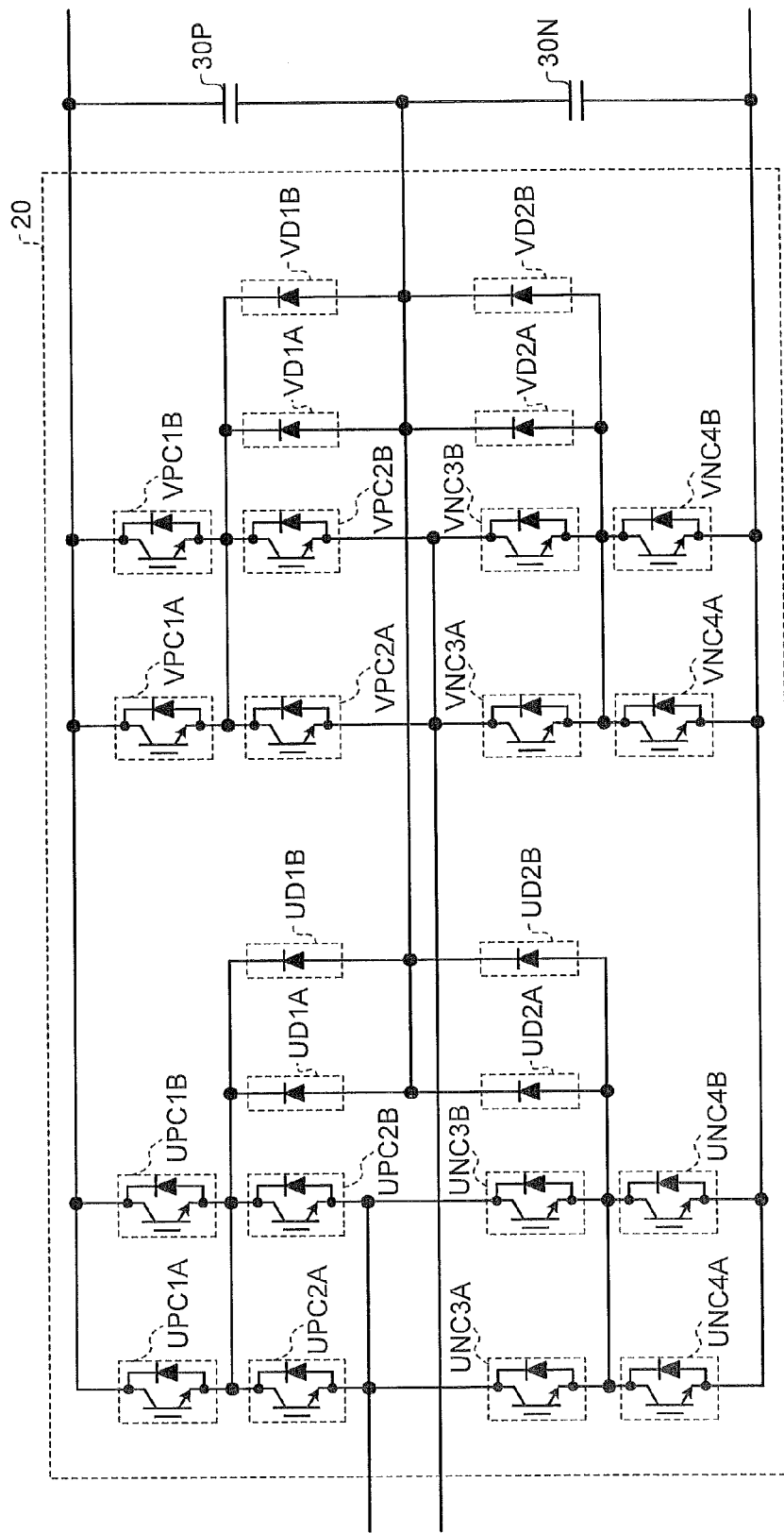
FIG. 13 is a diagram of an example of a circuit configuration of a converter unit according to a third embodiment of the present invention.

FIG. 13 is a diagram of an example of a circuit configuration of a converter unit 20b according to a third embodiment of the present invention. A converter unit 20b shown in FIG. 13 has a circuit configuration different from that of the converter unit 20 according to the first embodiment shown in FIG. 1 in that the converter unit 20b is configured as what is called a three-level circuit.

In FIG. 13, on the U-phase positive side, switching elements UPC1A and UPC1B that are connected in parallel and switching elements UPC2A and UPC2B that are connected in parallel are connected in series. In addition, to the connection point of this connection, the cathode side of diodes UD1A and UD1B that are connected in parallel is connected. Further, the anode side of the diodes UD1A and UD1B is connected to a midpoint (i.e., the connection point) between capacitors 30P and 30N. Similarly, in the U-phase negative-side arm, switching elements UNC3A and UNC3B that are connected in parallel and switching elements UNC4A and UNC4B that are connected in parallel are connected in series. In addition, to the connection point of this connection, the anode side of diodes UD2A and UD2B that are connected in parallel is connected. Further, the cathode side of the diodes UD2A and UD2B is connected to a midpoint (i.e., the connection point) between the capacitors 30P and 30N. The configurations of the V-phase positive-side arm and the V-phase negative-side arm are the same as those of the U-phase positive-side arm and the U-phase negative-side arm, respectively. Thus, the detailed explanation of the configurations of these connections will be omitted.

Loss percentage for each of the phases in the switching elements and the diode elements in the case where the converter unit 20b is caused to perform a switching operation with a switching frequency of approximately 1 kHz is shown in Table 1 below. In Table 1, a loss corresponding to one phase is expressed as 100%, while the U-phase is used as an example.

TABLE 1

| Loss Percentages of Elements | | | | | |
|---|---|---|---|---|---|
| UPC1 | UPC2 | UD1 | UD2 | UNC3 | UNC4 |
| 13% | 32% | 5% | 5% | 32% | 13% |

By referring to Table 1, it is understood that the switching elements UPC2 and UNC3 have a higher percentage of loss than the other elements.

Figure 14:
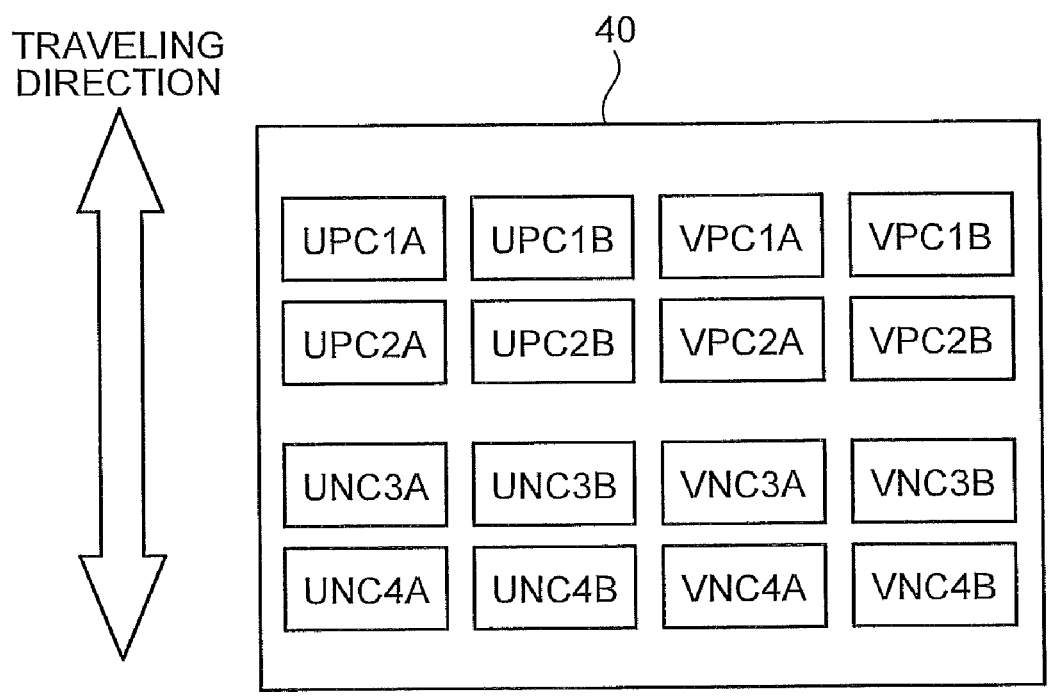
FIG. 14 is a drawing of an example of a positional arrangement of switching elements disposed on a fin base according to the third embodiment of the present invention.

Next, an example of a positional arrangement of the switching elements that is suitable for the situation in which the switching elements are connected in parallel will be explained. FIG. 14 is a drawing of an example of a positional arrangement of the switching elements disposed on the fin base 40 according to the third embodiment of the present invention. As shown in FIG. 14, the group of switching elements that structure each of the legs (i.e., a positive-side arm and a negative-side arm) corresponding to the phases are longitudinally arranged in a row on the fin base 40 in the traveling direction.

More specifically, let us explain while using U-phase legs as an example. The switching elements UPC1A and UPC2A included in the positive-side arm and the switching elements UNC3A and UNC4A included in the negative-side arm are arranged in a row in the stated order in the traveling direction. Further, being positioned adjacent to the U-phase leg, the switching elements UPC1B and UPC2B included in the positive-side arm and the switching elements UNC3B and UNC4B included in the negative-side arm that are respectively connected in parallel to those switching elements in a direction perpendicular to the traveling direction are arranged in a row in the stated order. As for the diodes UD1A, UD2A, UD1B, and UD2B, because the loss percentages thereof are as small as approximately 10% of the total, as shown in Table 1, these diodes are not taken into consideration. Similarly, the switching elements in the other phases are also arranged in a row in a direction perpendicular to the traveling direction.

Let us discuss a situation in which the positional arrangement of the switching elements is as shown in FIG. 14, while the traveling direction and the orientation direction of the fins were perpendicular to the traveling direction shown in FIG. 14. In that situation, the traveling airflows W would pass through the four elements having a larger loss (e.g., the switching elements UPC2A, UPC2B, VPC2A, and VPC2B). As a result, the temperatures of the switching elements that are positioned on the airflow downstream side would rise due to the heat generated by the switching elements that are positioned on the airflow upstream side.

In contrast, when the switching elements are positioned as described above, it is possible to minimize the size of the fins 42 in the traveling direction. As a result, it is possible to keep the decrease in the speed of the traveling airflows W at minimum at the positions of the switching elements positioned on the airflow downstream side. Consequently, it is possible to keep the increase in the temperatures of the switching elements positioned on the airflow downstream side at minimum.

In addition, it is possible to minimize the number of switching elements through which the traveling airflows W pass between the flow-in from the previous section of the fins 42 and the flow-out to the following section and to minimize the total losses (UPC1A+UPC2A+UNC3A+UNC4A in the U-phase). Thus, an advantageous effect is achieved where it is possible to alleviate the circumstances in which the temperatures of the traveling airflows W rise due to the heat generated by the switching elements positioned on the airflow upstream side, and as a result of the temperature rise, the temperatures of other switching elements positioned on the airflow downstream side also rise. In the description of the third embodiment, the converter unit 20 is explained as an example; however, the same configuration may be applied to the inverter unit 60.

Fourth Embodiment

Figure 15:
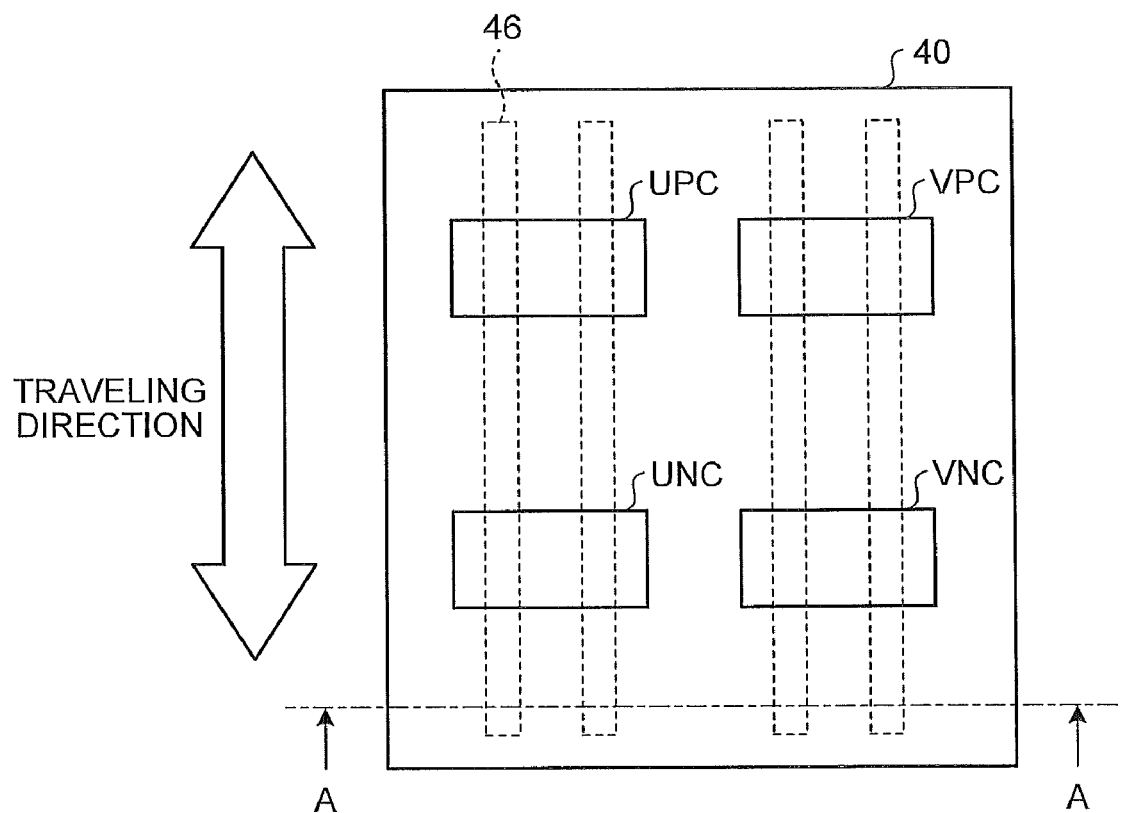
FIG. 15 is a diagram of a part of an internal structure of a fin base according to a fourth embodiment of the present invention.
Figure 16:
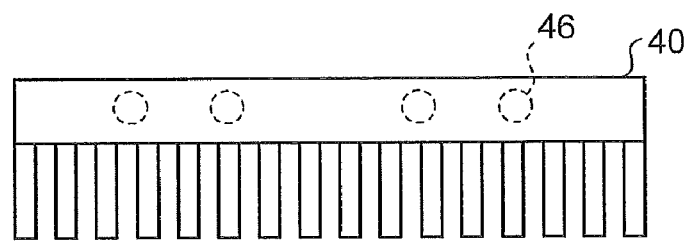
FIG. 16 is a cross-sectional view taken along the line A-A shown in FIG. 15.

FIG. 15 is a diagram of a part of an internal structure of a fin base according to a fourth embodiment of the present invention. FIG. 16 is a cross-sectional view taken along the line A-A shown in FIG. 15. A plurality of heat pipes 46 are inserted in the fin base 40 shown in FIGS. 15 and 16 to be positioned immediately beneath the switching elements, while being disposed to extend in the traveling direction. The heat pipes 46 are publicly-known means. Each of the heat pipes 46 is prepared by using a hollow pipe having a diameter of approximately 10 mm of which a main ingredient is copper and that has a capillary process called "wick" applied to the inside thereof; putting an operation fluid such as a small amount of water into the hollow pipe; and sealing the hollow pipe in a vacuum environment.

With the arrangement described above, for example, the water in the heat-distributing pipes is vaporized by the heat generated by the switching elements positioned on the airflow downstream side and absorbs the heat in the surroundings of the pipes. Further, the vapor moves to the airflow upstream side where the temperature is lower, is condensed to dissipate the heat, becomes water again, and moves to the airflow downstream side. By repeating this cycle, it is possible to transfer the heat on the side having a higher temperature to the side having a lower temperature. As a result, it is possible to make the temperatures on the airflow upstream side and the airflow downstream side of the fin base 40 uniform. Consequently, it is possible to further improve the cooling performance for the switching elements positioned on the airflow downstream side.

Fifth Embodiment

Figure 17:
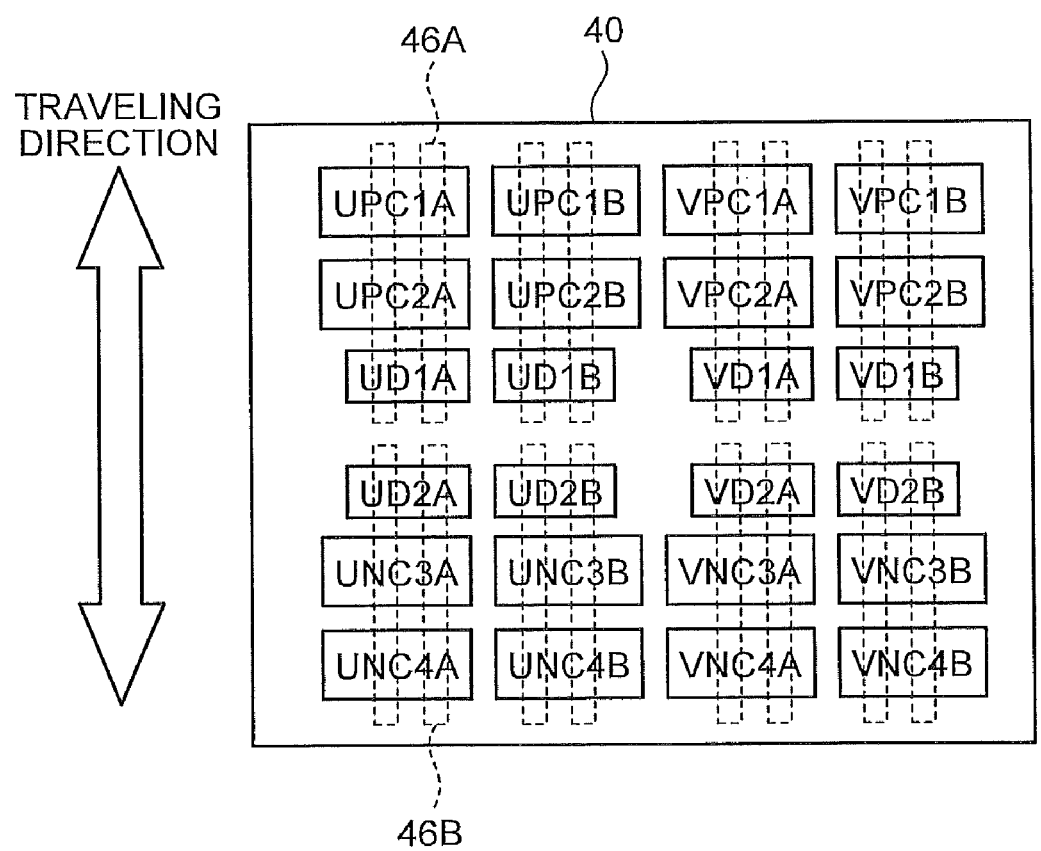
FIG. 17 is a drawing of an example of a positional arrangement of switching elements and an example of a positional arrangement of heat pipes with respect to a fin base for a converter unit according to a fifth embodiment of the present invention.

FIG. 17 is a drawing of an example of a positional arrangement of switching elements and an example of a positional arrangement of heat pipes with respect to the fin base 40A for the converter unit 20 according to a fifth embodiment of the present invention. Like in the example shown in FIG. 14, the group of switching elements that structure each of the legs (i.e., a positive-side arm and a negative-side arm) corresponding to the phases are longitudinally arranged in a row on the fin base 40 in the traveling direction. More specifically, let us explain while using U-phase legs on one side as an example. The switching elements UPC1A and UPC2A included in the positive-side arm and the switching elements UNC3A and UNC4A included in the negative-side arm are arranged in a row in the stated order in the traveling direction. The diodes UD1A and UD2A that are omitted from FIG. 14 are positioned between the switching element UPC2A included in the positive-side arm and the switching element UNC3A included in the negative-side arm, as shown in FIG. 17. The losses of these diodes are as small as approximately 10% of the total, as shown in Table 1. The other legs are also configured in the same manner.

Next, a positional arrangement of heat pipes 46A and 46B will be explained. The heat pipes 46A and the heat pipes 46B are provided; however, a U-phase leg on one side will be explained as an example. The fin base 40 has built therein: the heat pipe 46A that is disposed to pass immediately beneath the switching elements UPC1A and UPC2A included in the positive-side arm, such that one end thereof extends up to a region that is not immediately beneath the switching element UPC1A, whereas the other end thereof extends up to a region that is not immediately beneath the switching element UPC2A; and the heat pipe 46B that is disposed to pass immediately beneath the switching elements UNC3A and UNC4A included in the negative-side arm, such that one end thereof extends up to a region that is not immediately beneath the switching element UNC3A, whereas the other end thereof extends up to a region that is not immediately beneath the switching element UNC4A. The heat pipe 46A and the heat pipe 46B are separate from each other.

Next, an operational performance that is achieved in the configuration described above will be explained. Because the losses of the switching elements UPC1A and UPC2A included in the positive-side arm are large, the temperatures of such regions of the fin base 40 that are positioned immediately beneath these switching elements become high. In contrast, the loss of the diode UD1A is small, such a region of the fin base 40 that is positioned immediately beneath this diode is low. In other words, there is a difference in the temperature between the regions that are positioned immediately beneath the switching elements UPC1A and UPC2A included in the positive-side arm and the region that is positioned immediately beneath the diode UD1A. In this circumstance, a part of the heat generated by the switching elements UPC1A and UPC2A included in the positive-side arm is transferred to the region of the fin base 40 that is positioned near the diode UD1A because of the function of the heat pipe 46A. Similarly, a part of the heat generated by the switching elements UNC3A and UNC4A included in the negative-side arm is transferred to the region of the fin base 40 that is positioned near the diode UD2A, because of the function of the heat pipe 46B.

As a result of the operational performance described above, the heat generated by the switching elements UPC1A, UPC2A, UNC3A, and UNC4A can be dissipated not only from some of the fins 42 in the regions that are positioned near these switching elements, but also from other fins 42 in the regions that are positioned near the diodes UD1A and UD2A. Thus, it is possible to effectively cool the switching elements UPC1A, UPC2A, UNC3A, and UNC4A, which have a larger loss. In other words, some of the fins 42 that are positioned near the diodes UD1A and UD2A, which have a smaller loss and have leeway in terms of the cooling performance, are effectively utilized in the cooling process of the switching elements UPC1A, UPC2A, UNC3A, and UNC4A, which have a larger loss. As a result, it is possible to improve the cooling performance for the switching elements UPC1A, UPC2A, UNC3A, and UNC4A without the need to make the fin size larger.

In this configuration, it is possible to have a larger amount of electric current flow into the switching elements UPC1A, UPC2A, UNC3A, and UNC4A. As a result, even if the fin size is the same, it is possible to increase the electric power capacity that can be converted. The operational performance achieved in the other legs is the same as the one described above.

An important aspect of the fifth embodiment lies in the configuration where a focus is placed on the different levels of losses of the switching elements (which denote, in the present example, the semiconductor elements including the diodes) that structure the electric power converting circuit, so that the heat generated by the elements having a larger loss is transferred to the regions near the elements having a smaller loss and so that some of the fins that are positioned near the elements having a smaller loss and having leeway in terms of the cooling performance are effectively utilized in the cooling process of the elements having a larger loss. In the description of the fifth embodiment, the configuration that is suitable for a single-phase three-level converter circuit is explained as an example; however, needless to say, it is possible to apply the configuration to other circuits such as a three-phase inverter circuit. Further, needless to say, the heat pipes may be divided into smaller portions, as necessary, according to the circuit configuration and the positional arrangement of the elements.

The configurations explained in the exemplary embodiments described above form only an example of the contents of the present invention. It is possible to combine those configurations with other publicly-known techniques. Needless to say, it is possible to apply modifications to those configurations by, for example, omitting a part thereof, without departing the gist of the present invention.

Further, in the present description, the contents of the present invention is explained mainly through the applications to the railway electric cars. However, the applicable usage of the present invention is not limited to railway electric cars. Needless to say, it is possible to apply the present invention to other related fields such as electric automobiles.

INDUSTRIAL APPLICABILITY

As explained above, the electric power converting apparatus according to an aspect of the present invention is useful as an invention that is able to realize an electric power converting apparatus in which the switching elements are cooled by using airflows caused by a vehicle's traveling and that can be even more compact and more light-weighted.

The invention claimed is:
1. An electric power converting apparatus configured to be applied to a railway electric car operated in an alternate-current electrified railway section, the electric power converting apparatus comprising:
a converter unit that converts an alternate current to a direct current;
an inverter unit that is connected to an output side of the converter unit via a direct-current power source and converts a direct current from the direct-current power source into an alternate current to supply an electric power to an electric motor that drives the railway electric car; and
a cooling device for cooling a plurality of switching elements included in each of the converter unit and the inverter unit, wherein
the cooling device includes
a fin base that serves as a switching element attachment plane on which the switching elements are mounted, and
a plurality of fins arranged on a plane opposite to the switching element attachment plane such that the fins are cooled by an airflow caused by traveling of the railway electric car, and
the switching elements of the converter unit and the switching elements of the inverter unit have different relationships between a heat generation amount and a speed of the railway electric car,
the heat generation amount of the switching elements of the converter unit is maximized when the speed of the railway electric car is in a speed range that is equal to or higher than 30% to 50% of a maximum speed, so that a first fin pitch of the fins for the converter unit is set to a value with which a cooling performance of the cooling device is maximized when the speed of the railway electric car is in a speed range that is equal to or higher than 30%,
the heat generation amount of the switching elements of the inverter unit is maximized when the speed of the railway electric car is in a speed range that is equal to or lower than 30% to 50% of the maximum speed, so that a second fin pitch of the fins for the inverter unit is set to a value with which a cooling performance of the cooling device is maximized when the speed of the railway electric car is in a speed range that is equal to or lower than 50%, and the first fin pitch is smaller than the second fin pitch.

2. The electric power converting apparatus according to claim 1, wherein each of the converter unit and the inverter unit is either one of a single-phase bridge circuit and a multi-phase bridge circuit including a plurality of sets of legs each formed with a positive-side arm and a negative-side arm each including the switching elements, and the switching elements that constitutes each of the legs of different phases are arranged in a row on the fin base in a traveling direction of the railway electric car.

3. The electric power converting apparatus according to claim 1, wherein each of the converter unit and the inverter unit is either one of a single-phase bridge circuit and a multi-phase bridge circuit including a plurality of sets of legs each formed with a positive-side arm and a negative-side arm each including the switching elements, and the legs of different phases are arranged in a row on the fin base in a direction perpendicular to a traveling direction of the railway electric car.

4. The electric power converting apparatus according to claim 2, wherein the switching elements are connected in parallel in each of the positive-side arm and the negative-side arm, and sets of arms of a same type each formed with parallelly connected switching elements are arranged in a row on the fin base in the direction perpendicular to the traveling direction of the railway electric car.

5. The electric power converting apparatus according to claim 2, wherein the switching elements are connected in parallel in each of the positive-side arm and the negative-side arm, and the switching elements that are connected in parallel are arranged at regular intervals from a front edge of the fin base in the traveling direction of the railway electric car.

6. The electric power converting apparatus according to claim 1, wherein each of the switching elements has a rectangular shape having a long side and a short side, and the switching elements are arranged in a row on the fin base such that long sides are arranged in a direction perpendicular to the traveling direction of the railway electric car.

7. The electric power converting apparatus according to claim 1, wherein the cooling device includes
a first cooling device for the converter unit, and
a second cooling device for the inverter unit, and
the first cooling device and the second cooling device are provided separately.

8. The electric power converting apparatus according to claim 1, wherein a thickness of each of the fins is in a range from 2 millimeters to 4 millimeters, a first fin pitch of the fins provided on the fin base for the converter unit is set to a value between 6.5 millimeters and 11.5 millimeters, and a second fin pitch of the fins provided on the fin base for the inverter unit is set to a value between 8.5 millimeters and 15.5 millimeters.

9. The electric power converting apparatus according to claim 1, wherein a thickness of each of the fins is in a range from 2 millimeters to 4 millimeters, a first fin pitch of the fins provided on the fin base for the converter unit is set to a value between 8 millimeters and 10 millimeters, and a second fin pitch of the fins provided on the fin base for the inverter unit is set to a value between 10 millimeters and 14 millimeters.

10. The electric power converting apparatus according to claim 2, wherein each of the legs of the converter unit includes a first switching element, a second switching element, a third switching element, and a fourth switching element connected in series, the first switching element and the second switching element forming the positive-side arm, the third switching element and the fourth switching element forming the negative-side arm, the direct-current power source includes a first direct-current power source and a second direct-current power source connected in series, a first end of the first switching element is connected to a positive side of the first direct-current power source, and a first end of the fourth switching element is connected to a negative side of the second direct-current power source, the converter unit further includes
a first diode of which a cathode is connected to a connection point between the first switching element and the second switching element and an anode is connected to a midpoint between the first direct-current power source and the second direct-current power source, and a second diode of which an anode is connected to a connection point between the third switching element and the fourth switching element and a cathode is connected to a midpoint between the first direct-current power source and the second direct-current power source, a three-level circuit is formed in which a connection point between the second switching element and the third switching element is configured to be drawn to outside, and the first switching element, the second switching element, the third switching element, and the fourth switching element are arranged in a row on the fin base in the traveling direction of the railway electric car.

11. The electric power converting apparatus according to claim 10, wherein the electric power converting circuit is either one of a single-phase bridge circuit and a multi-phase bridge circuit including the sets of legs each formed with the first switching element, the second switching element, the third switching element, and the fourth switching element, and the legs of different phases are arranged in a row on the fin base in a direction perpendicular to the traveling direction of the railway electric car.

12. The electric power converting apparatus according to claim 2, wherein each of the legs of the converter unit includes a first switching element, a second switching element, a third switching element, and a fourth switching element connected in series, the first switching element and the second switching element forming the positive-side arm, the third switching element and the fourth switching element forming the negative-side arm,
the direct-current power source includes a first direct-current power source and a second direct-current power source connected in series,
a first end of the first switching element is connected to a positive side of the first direct-current power source, and a first end of the fourth switching element is connected to a negative side of the second direct-current power source,
the converter unit further includes
a first diode of which a cathode is connected to a connection point between the first switching element and the second switching element and an anode is connected to a midpoint between the first direct-current power source and the second direct-current power source, and
a second diode of which an anode is connected to a connection point between the third switching element and the fourth switching element and a cathode is connected to a midpoint between the first direct-current power source and the second direct-current power source,
a three-level circuit is formed in which a connection point between the second switching element and the third switching element is configured to be drawn to outside, and
the first switching element, the second switching element, the third switching element, and the fourth switching element are arranged in order in a row on the fin base in the traveling direction of the railway electric car.

13. The electric power converting apparatus according to claim 1, wherein
the fin base includes a plurality of embedded heat pipes, and
the heat pipes are arranged to pass immediately beneath the switching elements extending in the traveling direction of the railway electric car.

14. The electric power converting apparatus according to claim 2, wherein
the fin base includes a plurality of embedded heat pipes, and
the heat pipes are arranged to pass immediately beneath the switching elements included in the positive-side arm and the switching elements included in the negative-side arm extending in the traveling direction of the railway electric car.

15. The electric power converting apparatus according to claim 1, wherein
a heat pipe is embedded in the fin base, and
the heat pipe is arranged such that a first end is positioned near a region immediately beneath a switching element having a larger loss from among the switching elements included in the converter unit and the inverter unit and a second end is positioned near a region immediately beneath a switching element having a smaller loss from among the switching elements.

16. The electric power converting apparatus according to claim 14, wherein
each of the legs of the converter unit includes a first switching element, a second switching element, a third switching element, and a fourth switching element connected in series, the first switching element and the second switching element forming the positive-side arm, the third switching element and the fourth switching element forming the negative-side arm,
the direct-current power source includes a first direct-current power source and a second direct-current power source connected in series,
a first end of the first switching element is connected to a positive side of the first direct-current power source, and a first end of the fourth switching element is connected to a negative side of the second direct-current power source,
the converter unit further includes
a first diode of which a cathode is connected to a connection point between the first switching element and the second switching element and an anode is connected to a midpoint between the first direct-current power source and the second direct-current power source, and
a second diode of which an anode is connected to a connection point between the third switching element and the fourth switching element and a cathode is connected to a midpoint between the first direct-current power source and the second direct-current power source,
a three-level circuit is formed in which a connection point between the second switching element and the third switching element is configured to be drawn to outside,
the first switching element, the second switching element, the third switching element, and the fourth switching element are arranged in order in a row on the fin base in the traveling direction of the railway electric car, and
the heat pipes are embedded in the fin base, and
the heat pipes includes
a first heat pipe that is arranged to pass immediately beneath the first switching element and the second switching element such that a first end of the first heat pipe extends up to a region beyond beneath the first switching element and a second end of the first heat pipe extends up to a region beyond beneath the second switching element and near a region immediately beneath the first diode, and
a second heat pipe that is arranged to pass immediately beneath the third switching element and the fourth switching element such that a first end of the second heat pipe extends up to a region beyond beneath the third switching element and a second end of the second heat pipe extends up to a region beyond beneath the fourth switching element and near a region immediately beneath the second diode.

* * * * *